United States Patent [19]
Liu et al.

[11] Patent Number: 5,932,376
[45] Date of Patent: Aug. 3, 1999

[54] PHASE-SHIFTING MASK STRUCTURE

[75] Inventors: Wei-Jyh Liu, Taipei; Chen-Hao Hwang, Chang-Hua Hsien; Lien-Sheng Chung, Hsinchu, all of Taiwan

[73] Assignee: United Microelectronics Corp., Taiwan

[21] Appl. No.: 08/979,927

[22] Filed: Nov. 26, 1997

[30] Foreign Application Priority Data

Sep. 23, 1997 [TW] Taiwan ................................. 86113775

[51] Int. Cl.⁶ ..................................................... G03F 9/00
[52] U.S. Cl. ................................................. 430/5; 430/22
[58] Field of Search ......................... 430/5, 22; 356/401, 356/399

[56] References Cited

U.S. PATENT DOCUMENTS 5,674,650 10/1997 Dirksen et al. ........................... 430/22
5,733,690 3/1998 Jeong et al. ................................ 430/5
5,770,338 6/1998 Lim et al. ................................. 430/22

*Primary Examiner*—S. Rosasco
*Attorney, Agent, or Firm*—Rabin & Champagne, P.C.

[57] ABSTRACT

A phase-shifting mask structure has a base plate, a pattern zone on the base plate and a peripheral region on the periphery of the base plate around the pattern zone. The peripheral region and the pattern zone further have a plurality of alignment-checking patterns and alignment slits. Each alignment-checking pattern has a first pattern of light-blocking thin films and a second pattern of light-penetrating thin films. Similarly, each alignment slit has a third pattern of light-blocking thin films and a fourth pattern of light-penetrating thin films. In this invention, absolute light-blocking thin films are used in the light-blocking portions of the alignment-checking pattern and the alignment slits instead of the semi-transparent thin films in a conventional system. Thus, alignment checking errors due to the distortion of fiducial marks are minimized, and mask layers are more precisely aligned.

12 Claims, 6 Drawing Sheets

PHASE-SHIFTING MASK STRUCTURE

BACKGROUND OF THE INVENTION

1. Field of Invention

The present invention relates to a phase-shifting mask structure. More particularly, the present invention relates to a phase-shifting mask structure that produces improved alignment and an increased precision in alignment checking.

2. Description of Related Art

In photolithographic processing, the maximum resolution provided by exposure is closely related to the wavelengths of the light source and the depth of focus (DOF). When a shorter wavelength light source is used, or when the depth of focus is increased, the resolution obtained is better. However, when the wavelength of the light source is shorter, the depth of focus will be smaller. That is, the two have a reciprocal relationship. Therefore, in the design of an exposure system, a certain trade-off must be made to get the highest resolution from the system. In general, the most common wavelengths for the light source in photolithographic processing operation include two main types, the so-called g-line and the i-line. The former has a wavelength of 4460 Å, which is in the ultra-violet region, while the latter has a wavelength of 3650 Å. Currently, even deep ultra-violet light that has a wavelength of 2480 Å is sometimes used as the light source in the exposure.

Besides using shorter wavelength light as the light source, another method to increase resolution is to use a phase-shifting photolithographic technique. A phase-shifting technique is similar to a conventional one. The only difference is the addition of a phase-shifting layer over all of the photomask. Through the negative-positive interference between the photomask and the phase-shifting layer, the pattern projected onto the wafer by the projector has a higher resolution.

In photolithographic processing, the tools necessary for the operation, besides a light source, also include a supply of mask for the transfer of circuit patterns. The main body of the mask is a piece of flat and transparent glass, including a layer of chromium having a thickness of several hundred angstroms disposed over the surface. To minimize reflection during exposure, sometimes an additional layer of chromium dioxide is formed above the chromium film. In order to increase the resolution of transferred patterns, patterns are transferred by a stepper in a step-and-repeat fashion such that various mask patterns are transferred one-by-one in many exposures to a wafer.

When various mask patterns are exposed layer by layer on top of the wafer, the top and bottom mask patterns must be perfectly aligned before and after the exposure. As shown in FIG. 1, one way to ensure that the patterns are properly aligned is to make use of alignment slits 16 and alignment-checking patterns 18 on the peripheral region 12 around the pattern zone 14 of a mask plate 10. In practice, the alignment slits 16 are first checked to make sure the mask pattern is properly aligned before the exposure is performed. Then, the alignment-checking patterns 18 are used to countercheck the precision of alignment after the exposure.

FIG. 2A is a magnified view of the alignment-checking patterns 18 in FIG. 1. The alignment-checking patterns 18 include patterns 20 and complementary patterns 26 of light-blocking thin films, and corresponding patterns 22 and complementary patterns 24 of light-penetrating thin films. However, the light-blocking thin films do not block all in-coming light for the coventional phase shift mask. FIG. 2B is a magnified view of the alignment slits 16 in FIG. 1. The alignment slits 16 include a set of parallel strips 260 and a complementary pattern 200 of light-blocking thin films and a corresponding pattern 240 and a set of complementary parallel strips 220 of light-penetrating thin films. Again, the light-blocking thin films do not block all in-coming light.

In general, the light-blocking thin films of the alignment slits and the alignment-checking patterns on a phase-shifting layer used in a conventional process do not have absolute light-blocking power. In other words, the light-blocking thin films are actually semi-transparent to light. If such semi-transparent layers are used to carry out exposures and then develop on the wafer surface, the fiducial mark thus established is likely to be distorted and shifted. This will lead to alignment errors of the alignment checking system. Furthermore, since the patch of alignment profile left on the wafer is going to be fuzzy, subsequently laid mask patterns will be slightly misplaced too.

In light of the foregoing, there is a need in the art to improve the phase-shifting mask structure.

SUMMARY OF THE INVENTION

Accordingly, the present invention is directed to improve the phase-shifting mask structure so as to reduce errors in alignment checking by the alignment machines due to a distortion of the fiducial mark as a result of using semi-transparent light-blocking thin films.

To achieve these and other advantages and in accordance with the purpose of the invention, as embodied and broadly described herein, the invention provides a phase-shifting mask that includes a mask plate. The mask plate includes a pattern zone on the mask plate, and a peripheral region formed around the periphery of the pattern zone. A plurality of alignment slits and a plurality of alignment-checking patterns are formed in the pattern zone and the peripheral area. The plurality of alignment slits and the plurality of alignment-checking patterns are used for the precise positioning of the mask plate over the wafer and for checking the correctness of pattern alignment after exposure.

Each of the above alignment-checking patterns has a first pattern of light-blocking thin films and a second pattern of light-penetrating thin films. The alignment slits have a third pattern of light-blocking thin films and a fourth pattern of light-penetrating thin films. Moreover, all the light-blocking thin films block light completely. Alternately, the alignment-checking pattern can be formed from a first pattern of light-penetrating thin films and a second pattern of light-blocking thin films. The alignment slits can be formed from a third pattern of light-penetrating thin films and a fourth pattern of light-blocking thin films. Again, all the light-blocking thin films block light completely.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
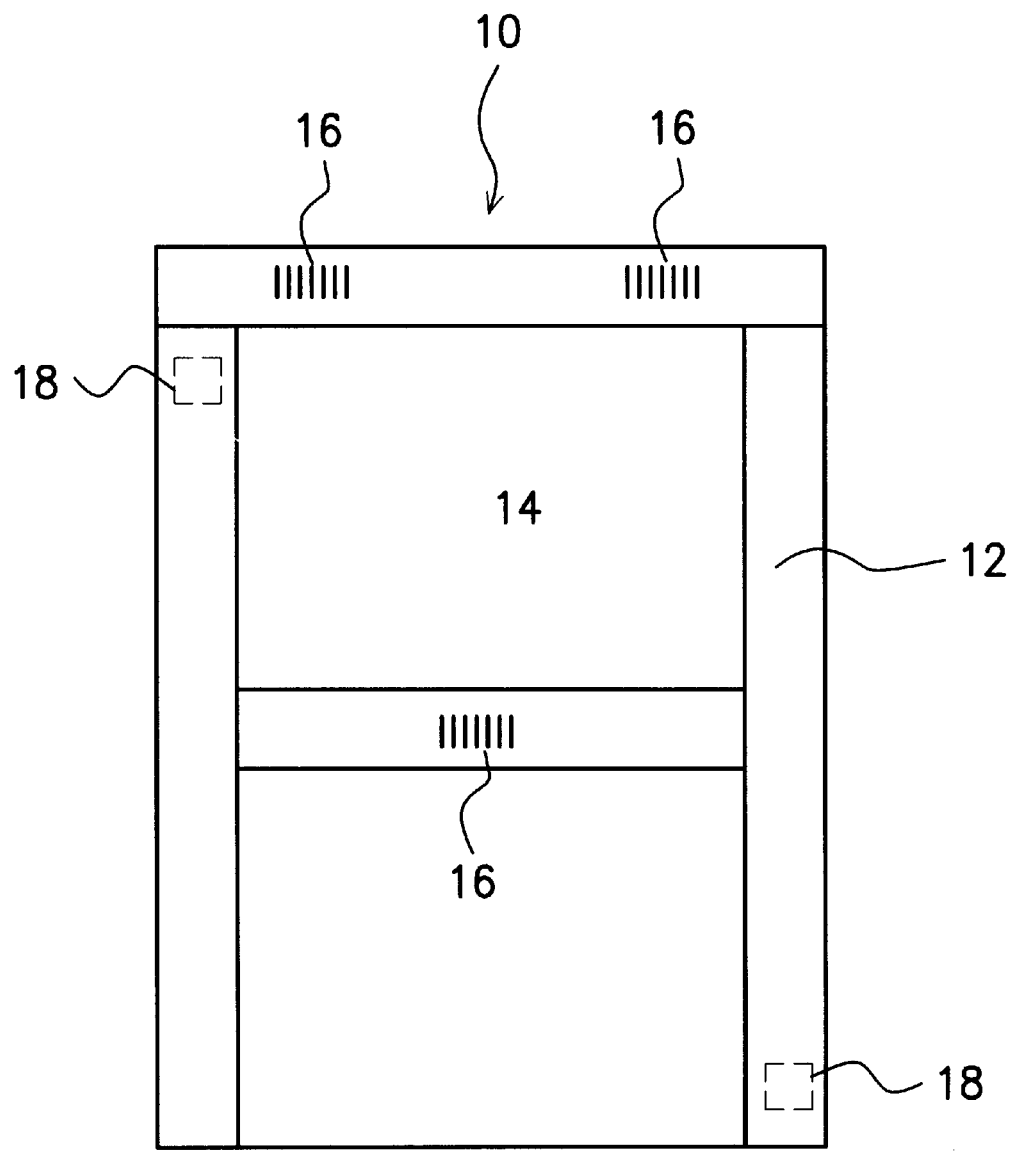
FIG. 1 is the top view of a conventional mask plate.
Figure 2A:
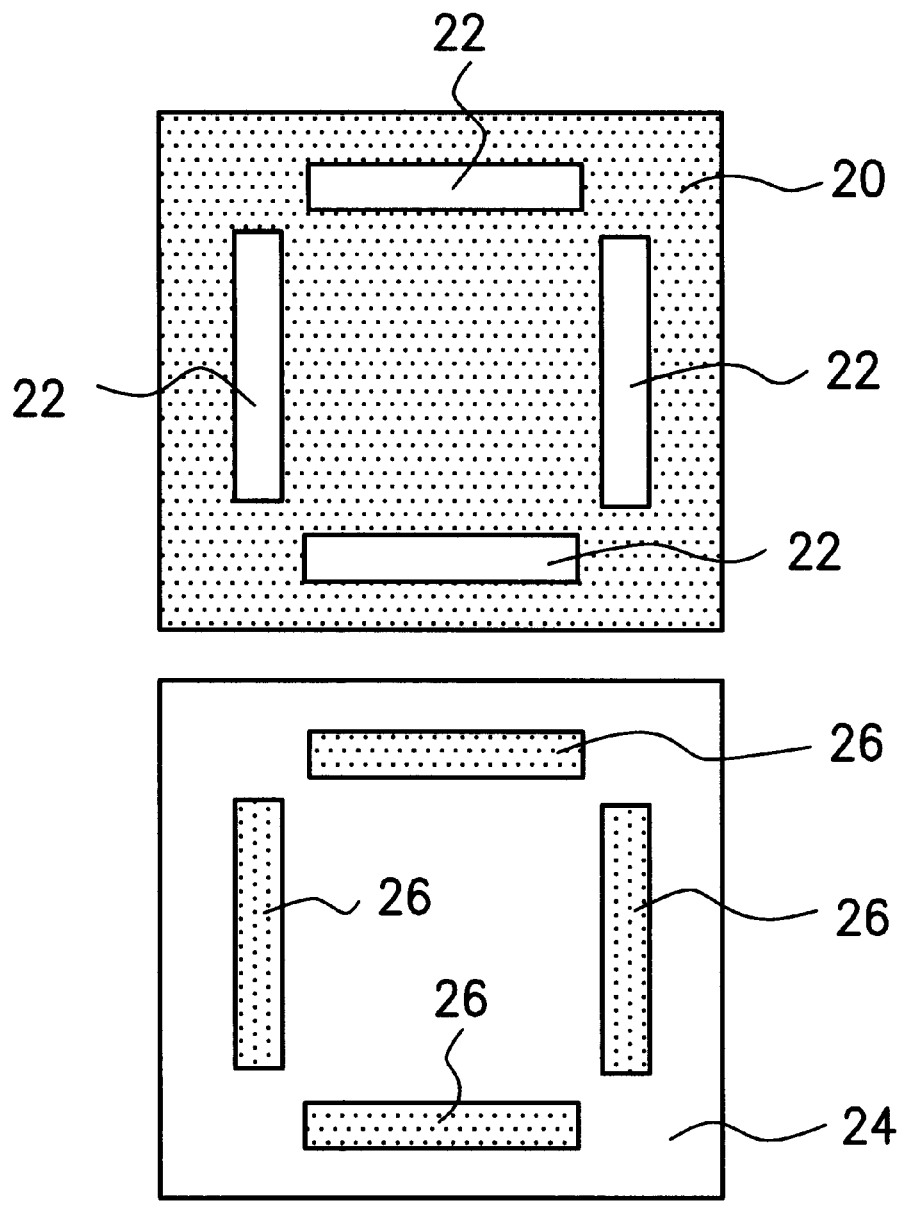
FIG. 2A is a magnified view of the alignment-checking patterns of FIG. 1.
Figure 2B:
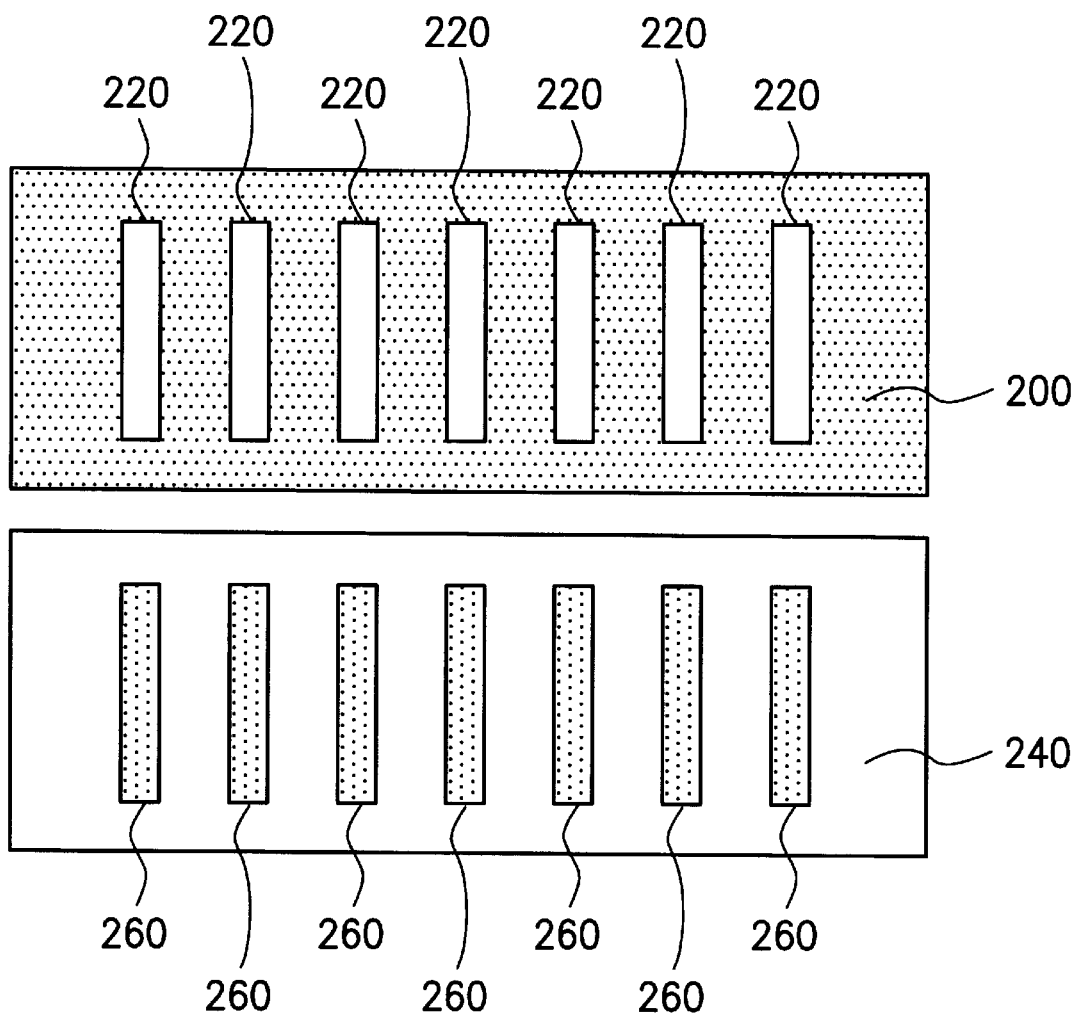
FIG. 2B is a magnified view of the alignment slits of FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
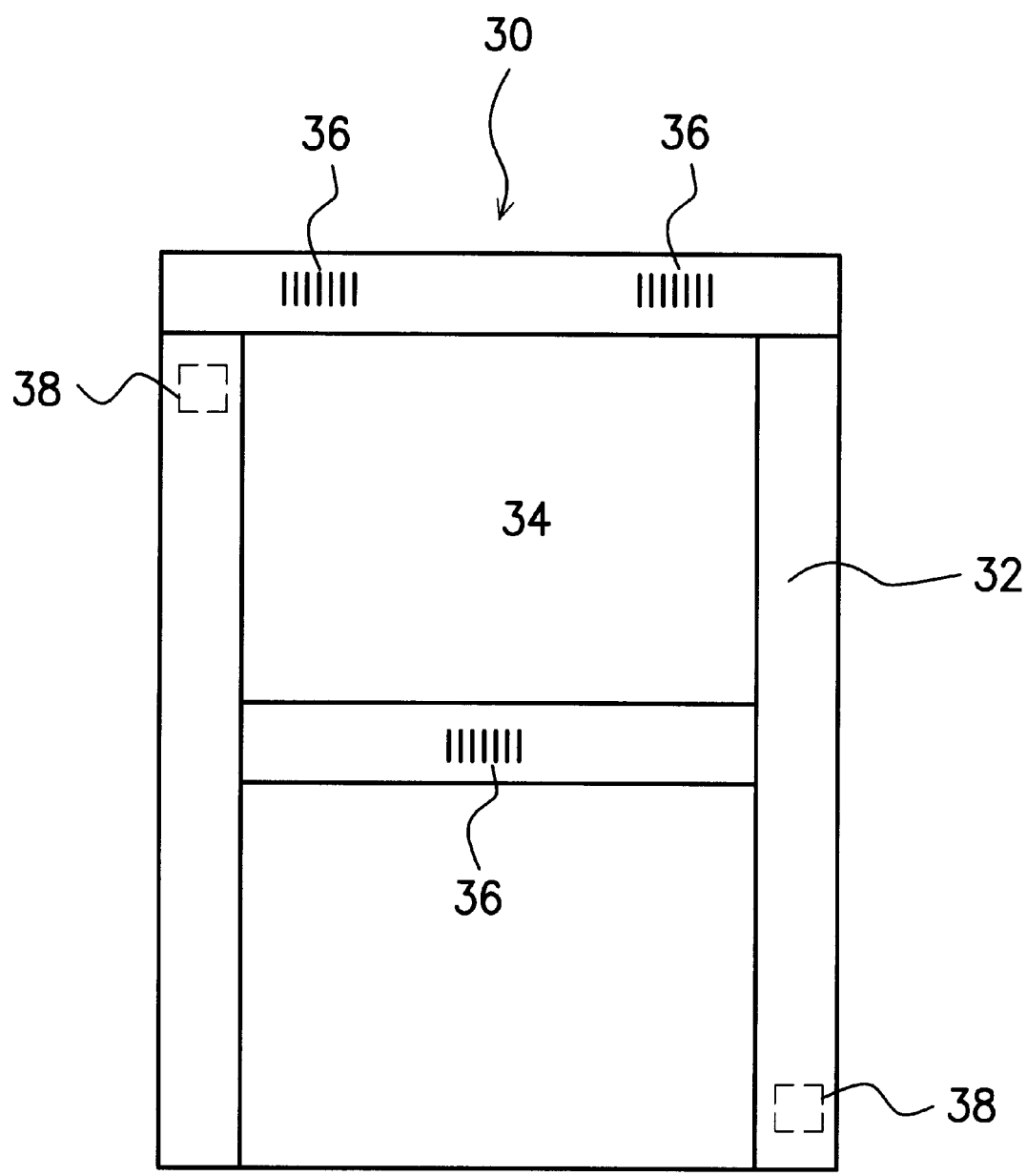
FIG. 3 is the top view of a mask plate according to one preferred embodiment of this invention.

FIG. 3 is the top view of a mask plate according to one preferred embodiment of this invention.

First, a mask plate having a peripheral region 32 around the periphery and a central pattern zone 34 is provided. Alignment slits 36 are formed in the peripheral region 32 and the pattern zone 34, and alignment-checking patterns 38 are formed in the peripheral region 32. The alignment slits 36 are used for aligning the mask plate 30 on a stepper with a corresponding marking in the wafer. The alignment-checking patterns 38 are used for checking the correctness of aligned patterns after exposure.

Figure 4A:
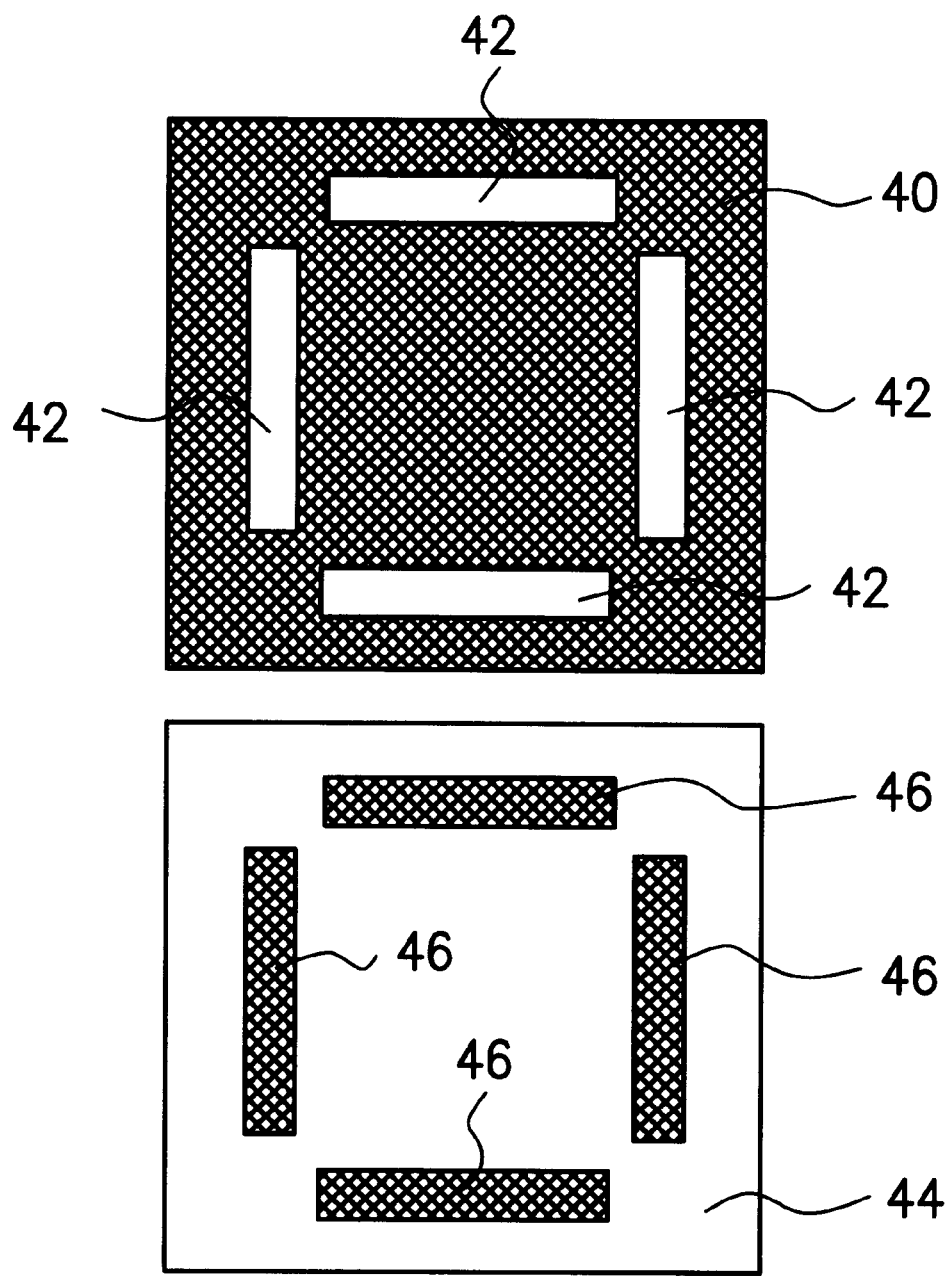
FIG. 4A is a magnified view of the alignment-checking patterns of FIG. 3.

FIG. 4A is a magnified view of the alignment-checking patterns of FIG. 3. As shown in FIG. 4A, the alignment-checking patterns 38 have a first pattern of light-blocking thin films 40 and a second pattern of light-penetrating thin films 42. Moreover, the light-blocking thin films 40 block light completely. Alternately, the alignment-checking patterns 38 can include a first pattern of light-penetrating thin films 44 and a second pattern of light-blocking thin films 46. Again, the light-blocking thin films 46 block light completely.

Figure 4B:
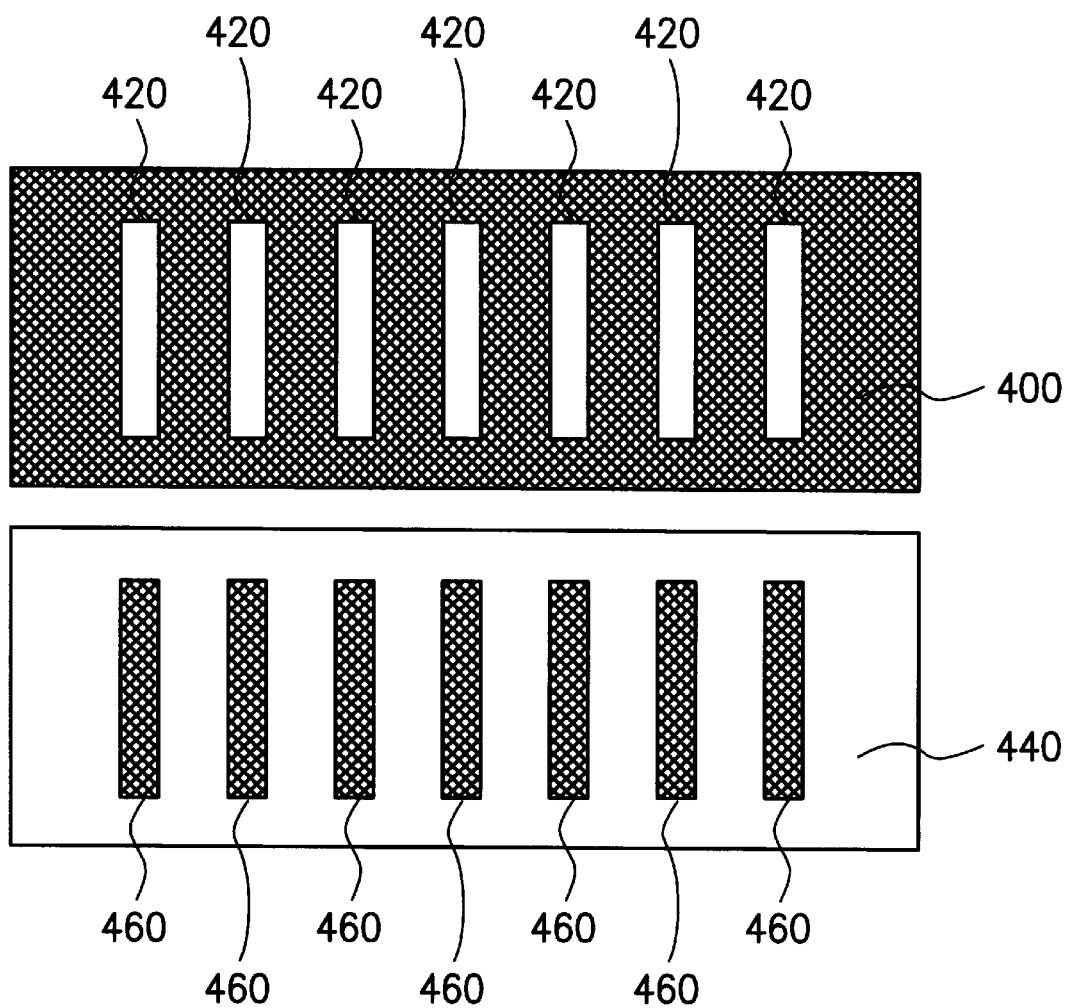
FIG. 4B is a magnified view of the alignment slits of FIG. 3.

FIG. 4B is a magnified view of the alignment slits of FIG. 3. As shown in FIG. 4B, the alignment slits 36 have a third pattern of light-blocking thin films 400 and a fourth pattern of light-penetrating thin films 420. Moreover, the light-blocking thin films 400 block light completely. Alternately, the alignment slits 36 can include a third pattern of light-penetrating thin films 440 and a fourth pattern of light-blocking thin films 460. Again, the light-blocking thin films 460 block light completely.

In this invention, absolute light-blocking thin films are used in the light-blocking portions of the alignment-checking pattern and the alignment slits instead of using semi-transparent thin films as in a conventional system. Thus, checking errors due to the distortion of fiducial marks are minimized, and mask layers are more precisely aligned.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase-shifting mask structure, comprising:

a mask plate;

a pattern zone on the mask plate;

a peripheral region on the mask plate and around [the] a periphery of the pattern zone;

a plurality of alignment-checking patterns in the peripheral region;

a plurality of alignment slits in the peripheral region and the pattern zone;

a first pattern of light-blocking thin films and a second pattern of light-penetrating thin films, included in the plurality of alignment-checking patterns; and a third pattern of light-blocking thin films and a fourth pattern of light-penetrating thin films, included in the plurality of alignment slits.

2. The structure of claim 1, wherein the first pattern of light-blocking thin films blocks light completely.

3. The structure of claim 1, wherein the third pattern of light-blocking thin films blocks light completely.

4. The structure of claim 1, wherein the plurality of alignment-checking patterns further include the second pattern of light-blocking thin films and the first pattern of light-penetrating thin films.

5. The structure of claim 1, wherein the plurality of alignment slits further include the fourth pattern of light-blocking thin films and the third pattern of light-penetrating thin films.

6. The structure of claim 4, wherein the second pattern of light-blocking thin films blocks light completely.

7. The structure of claim 5, wherein the fourth pattern of light-blocking thin films blocks light completely.

8. The structure of claim 1, wherein the second pattern of light-penetrating thin films is a second pattern of light-transparent thin films.

9. The structure of claim 1, wherein the fourth pattern of light-penetrating thin films is a fourth pattern of light-transparent thin films.

10. The structure of claim 8, wherein each of the plurality of alignment-checking patterns defines an area on the mask plate that includes only the first pattern of light-blocking thin films and the second pattern of light-penetrating thin films.

11. The structure of claim 9, wherein the plurality of alignment slits is a plurality of alignment slit regions, wherein each of the alignment slit regions defines an area on the mask plate that includes the third pattern of light-blocking thin films, and wherein the remainder of the alignment slit region other than the third pattern of light-blocking thin films is light-penetrating.

12. The structure of claim 9, wherein the plurality of alignment slits is a plurality of alignment slit regions, wherein each of the alignment slit regions defines an area on the mask plate that includes the fourth pattern of light-penetrating thin films, and wherein the remainder of the alignment slit region other than the fourth pattern of light-penetrating thin films is light-blocking.

* * * * *